US006877995B1

(12) United States Patent
Chen

(10) Patent No.: US 6,877,995 B1
(45) Date of Patent: Apr. 12, 2005

(54) EXPRESS CARD HOUSING STRUCTURE

(76) Inventor: George Chen, P.O. Box No. 6-57, Junghe, Taipei 235 (TW)

( * ) Notice: Subject to any disclaimer, the term of this patent is extended or adjusted under 35 U.S.C. 154(b) by 0 days.

(21) Appl. No.: 10/751,995

(22) Filed: Jan. 7, 2004

(51) Int. Cl.[7] ............................................. H01R 12/00
(52) U.S. Cl. ..................................... 439/76.1; 361/737
(58) Field of Search ............................... 439/76.1, 946; 361/737

(56) References Cited

U.S. PATENT DOCUMENTS

| 5,413,490 A | * | 5/1995 | Tan et al. .................. 439/76.1 |
| 5,476,387 A | * | 12/1995 | Ramey et al. ............. 439/76.1 |
| 5,505,628 A | * | 4/1996 | Ramey et al. ............. 439/76.1 |
| 5,529,503 A | * | 6/1996 | Kerklaan .................... 439/76.1 |

* cited by examiner

Primary Examiner—Phuong Dinh

(57) ABSTRACT

The invention discloses an express card housing structure serves as a housing for accommodating light in weight, small in size and portable hardware devices, which are used as memories or execute various media. The express card housing according to the invention utilizes fastening sections at two inner sides of a main frame thereof for fastening with fastening openings at two lateral sides of a lower housing, and an upper housing for corresponding with the lower housing. The main frame is disposed with a safety fastening opening at one side thereof, such that the upper and lower housings can be fastened with each other for facilitating installation and replacement processes.

4 Claims, 7 Drawing Sheets

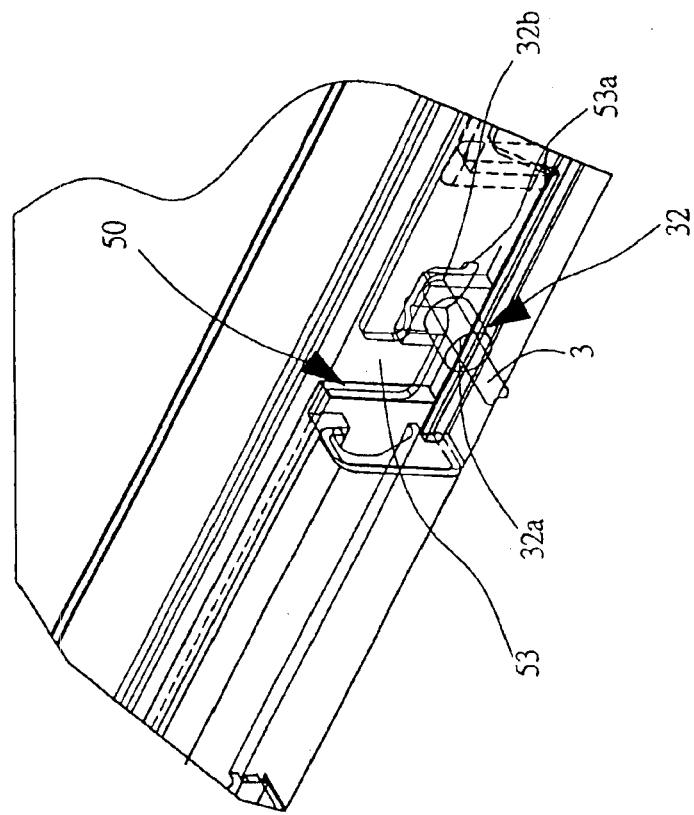
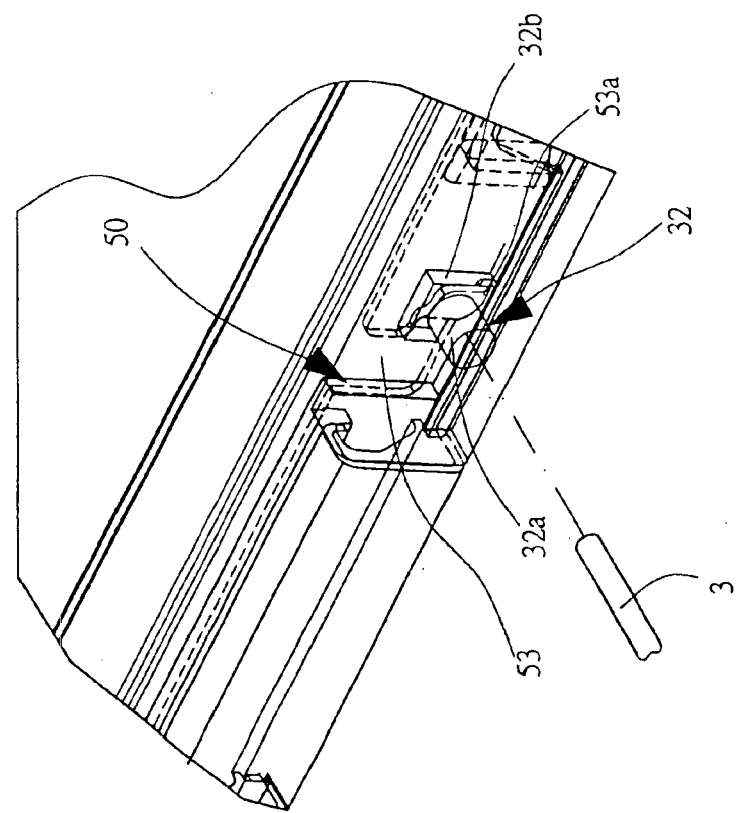
Fig.6A
Fig.6B

EXPRESS CARD HOUSING STRUCTURE

BACKGROUND OF THE INVENTION (a) Field of the Invention

The invention relates to an express card housing structure, and more particularly, to a housing for accommodating light in weight, small in size and portable hardware devices that serve as memories or execute various media for notebook expansions, and comprises a connector housing, terminals, a main frame, a lower housing and an upper housing.

(b) Description of the Prior Art

Due to rapid advancement of computer industries on top of market demands, newly defined express specifications are gradually replacing prior PCMCIA specifications. Based on requirements of upstream manufacturers, up-to-date housings for portable devices are needed.

SUMMARY OF THE INVENTION

Therefore, the primary object of the invention is to provide an express card housing structure having a simple replacement procedure.

Another object of the invention is to provide an express card housing structure capable of preventing disengagement of upper and lower housings from a main frame thereof.

The other object of the invention is to provide an express card housing structure that can be installed using a one-step installation process as well as having a connect pin section for reducing installation time needed for installing terminals.

To accomplish the aforesaid objects, an express card housing structure comprises a connector housing, terminals, a main frame, a lower housing and an upper housing. The terminals are devised as new-type express specifications as having a connect pin section for a one-step installation process, and are inserted via a terminal groove at a rear end of the connector housing. After snapping off terminal bodies at a front end of the terminals from a connecting portion at a rear end, terminal pins at a lower portion of terminal bodies are adhered to a printed circuit board (PCB). Fastening sections at two inner sides of the main frame are fastened with fastening openings at two lateral sides of the lower housing. At two sides of the lower housing are upwardly extended and inverted U-shaped clasp sections that are fixed in recesses at the two sides of the main frame, so as to place the connector housing and the PCB into the main frame. The connector housing has locating sections at the front end thereof for corresponding and inserting into locating notches of the main frame. U-shaped clasp sections at the two sides of the upper housing are clasped with the corresponding inverted L-shaped clasp sections of the lower housing. When the upper housing is fastened in a forward direction, a safety opening at one side of the main frame is corresponded with a safety fastening section of the upper housing, thereby completing an assembly of the invention.

According to the aforesaid structure, by corresponding and inserting the locating sections disposed at the front end of the connector housing into the locating notches of the main frame, the fastening sections at two inner sides of the main frame and fastening openings at two lateral sides of the lower housing, and the corresponding U-shaped clasp sections at two lateral sides of the upper housing and the inverted L-shaped clasp sections of the lower housing, the express card is provided with a simple installation and replacement process. In addition, when the upper housing is fastened in a forward direction, the safety fastening section of the upper housing is corresponded with and slid into the safety opening at one side of the main frame. Also, the outwardly and upwardly extended inverted U-shaped clasp sections at two lateral sides of the lower housing are located in the recesses at two lateral sides of the main frame, thereby preventing disengagement of the upper and lower housings from the main frame. In conjunction with new-type express specifications, the terminals are made into a structure having a connect pin and can be installed using one-step installation process by inserting the terminals from a rear end of the connector housing. The terminal bodies at the front end of the terminals are snapped off from the connecting portion at the rear end, and the terminal pins at the lower portion of the terminal bodies are adhered to a PCB, thereby reducing time required for installing the terminals.

BRIEF DESCRIPTION OF THE DRAWINGS

FIG. 6A shows a schematic view illustrating the safety fastening section fastened with the safety fastening opening according to the invention.

FIG. 6B shows a schematic view illustrating the safety fastening section released from the safety fastening opening according to the invention.

DETAILED DESCRIPTION OF THE PREFERRED EMBODIMENTS

To better understand the structures, devices and characteristics of the invention, detailed descriptions of a preferred embodiment shall be given with the accompanying drawings below.

Figure 1:
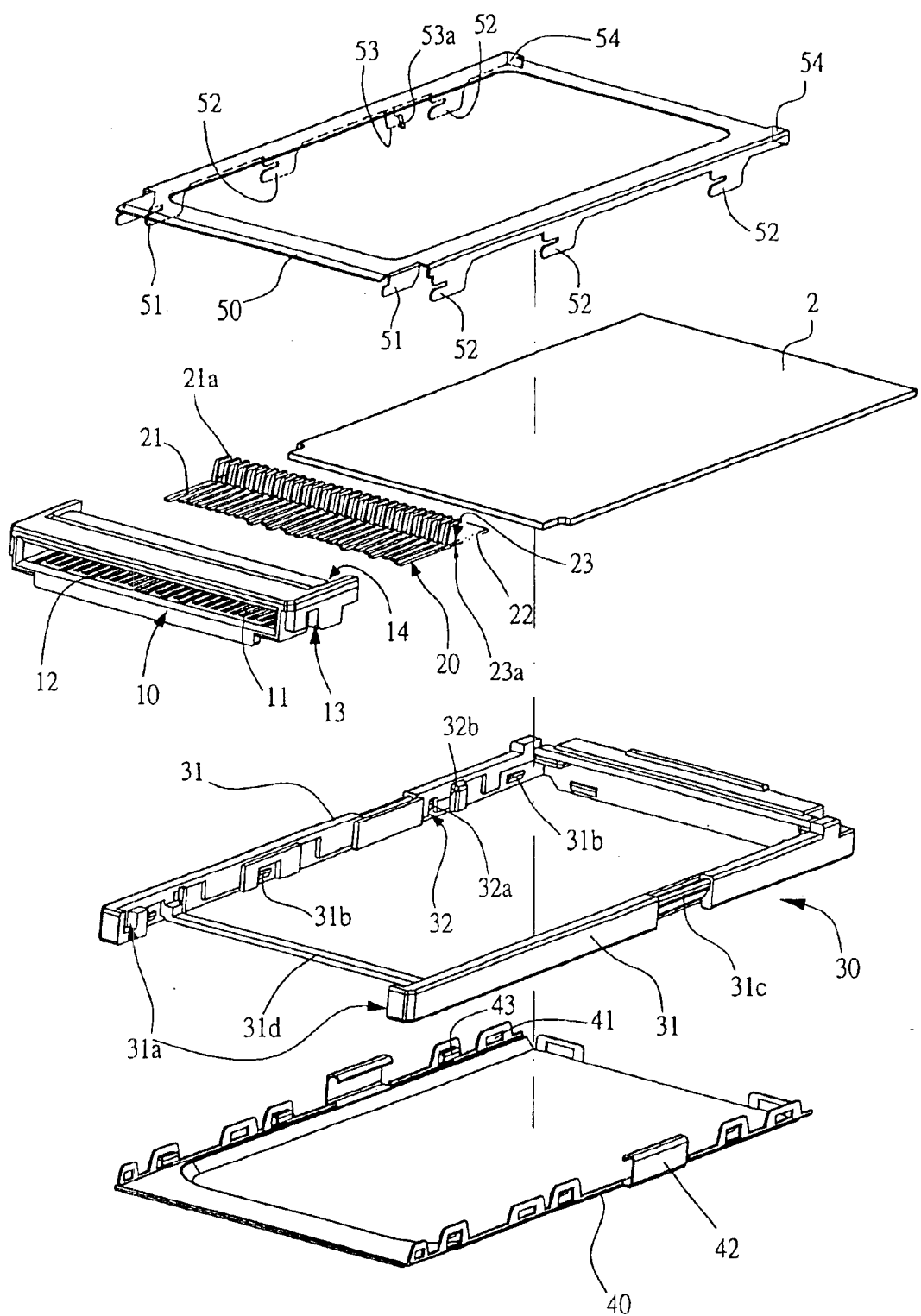
FIG. 1 shows an exploded elevational view according to the invention.
Figure 2:
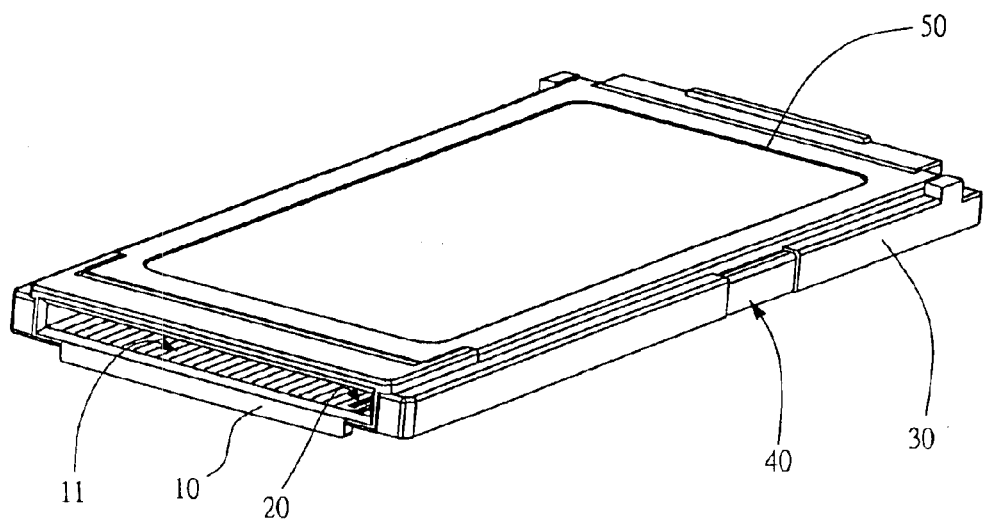
FIG. 2 shows an elevational view according to the invention.

Referring to FIGS. 1 and 2, an express card housing structure according to the invention comprises a connector housing 10, terminals 20, a main frame 30, a lower housing 40 and an upper housing 50.

The connector housing 10 is an integral and rectangular housing formed by plastic extrusion; and has a perforated terminal groove 11 at a center portion thereof, an opening 12 at a front end thereof connecting to a computer slot, locating sections 13 at left and right sides thereof, and clasp channels 14 at front and rear sides thereof.

The terminals 20 are formed by bent metals. Each terminal 20 is consisted of a terminal body 21 and a rear connecting portion 22, with a rear end of the terminal body 21 downwardly bent to form a terminal pin 21a. Between the terminal body 21 and the connecting portion 22 is a connect pin section 23, which is formed by excavating an inverted V-shape cleft 23a at an upper metal surface of the connecting portion 22 and is reserved with a small portion of metal for joining with the connecting portion 22 at the rear end.

The main frame 30 is an integral formed by metal molding or plastic extrusion, and appears as a U-shape when viewed from above. The main frame 30 has a post 31d at a front end of an opening thereof for joining left and right frames 31. Each of the left and right frames 31 is disposed with a locating notch 31a at a front end thereof, a plurality of fastening sections 31b at an inner edge thereof, a recess 31c at a center upper portion thereof, a safety fastening opening 32 at one side thereof, with the safety fastening opening 32 formed with a hole 32a at a center portion, and a square recess 32b formed regarding a center of the aforesaid hole 32a as a center at an inner side thereof.

The lower housing 40 is a housing body formed by shearing and stamping a metal plate; and has a plurality of fastening openings 41 at two lateral sides and a rear side thereof for corresponding with the fastening sections 31b of the main frame 30, inverted U-shaped clasp sections 42 extended outward and upward at center portions of two sides thereof for corresponding with recesses 31c of the main frame 30, and a plurality of inverted L-shaped clasp sections 43 at two lateral sides thereof.

The upper housing 50 is a housing body formed by shearing and stamping a metal plate; and has clasp section 51 at a front end thereof for clasping with the clasp channels at two sides of the connector housing, a plurality of U-shaped clasp sections 52 with openings facing a front side at two lateral sides thereof, a safety fastening section 53 for corresponding with the fastening opening 32 of the main frame 30 and, extruded with a square spring plate 53a, and a downwardly bent baffle 54 at a rear end thereof.

For assembly, the terminals 20 are inserted into the terminal groove 11 at the rear end of the connector housing 10. The terminal bodies 21 at the front end of the terminals 20 are snapped off from the rear connecting portion 22, and the terminal pin sections 21a at the lower portion of the terminal bodies 21 are adhered to a printed circuit board (PCB) 2. The fastening sections 31b at two inner sides of the main frame 30 are fastened with the fastening openings 41 at two lateral sides of the lower housing 40. The upwardly extended and inverted U-shaped clasp sections 42 at the two sides of the lower housing 40 are fixed in the recesses 31c at the two sides of the main frame 30. The connector housing 10 and the PCB 2 are placed into the main frame 30. The locating sections 13 at the front end of the connector housing 10 are corresponded with and inserted into the locating notches 31a of the main frame 30. The U-shaped clasp sections 52 at the two sides of the upper housing 50 are clasped with the corresponding inverted L-shaped clasp sections 43 of the lower housing 40. When the upper housing 50 is fastened in a forward direction, the safety opening 2 at one side of the main frame 30 is corresponded with the safety fastening section 53 of the upper housing, thereby completing an assembly of the invention.

Figure 3:
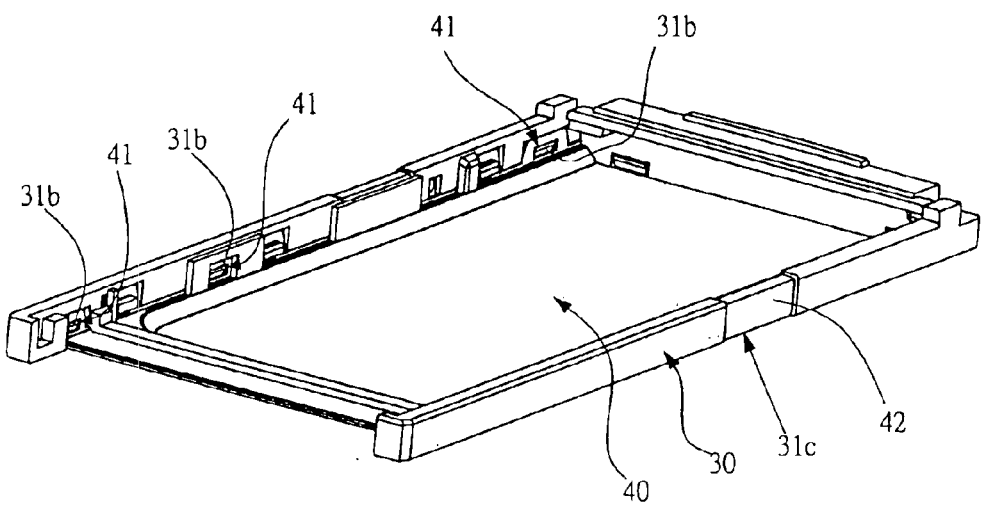
FIG. 3 shows a schematic view illustrating a lower housing joined with a main frame according to the invention.

Referring to FIG. 3 showing a schematic view illustrating the lower housing 40 joined with the main frame 30, the fastening sections 31b at two inner sides of the main frame 30 are fastened with the fastening openings 41 at two sides of the lower housing 40, and the outwardly, upwardly extended and inverted U-shaped clasp sections 42 of the lower housing 40 are fastened in the recesses 31c at the two sides of the main frame 30.

Figure 4A:
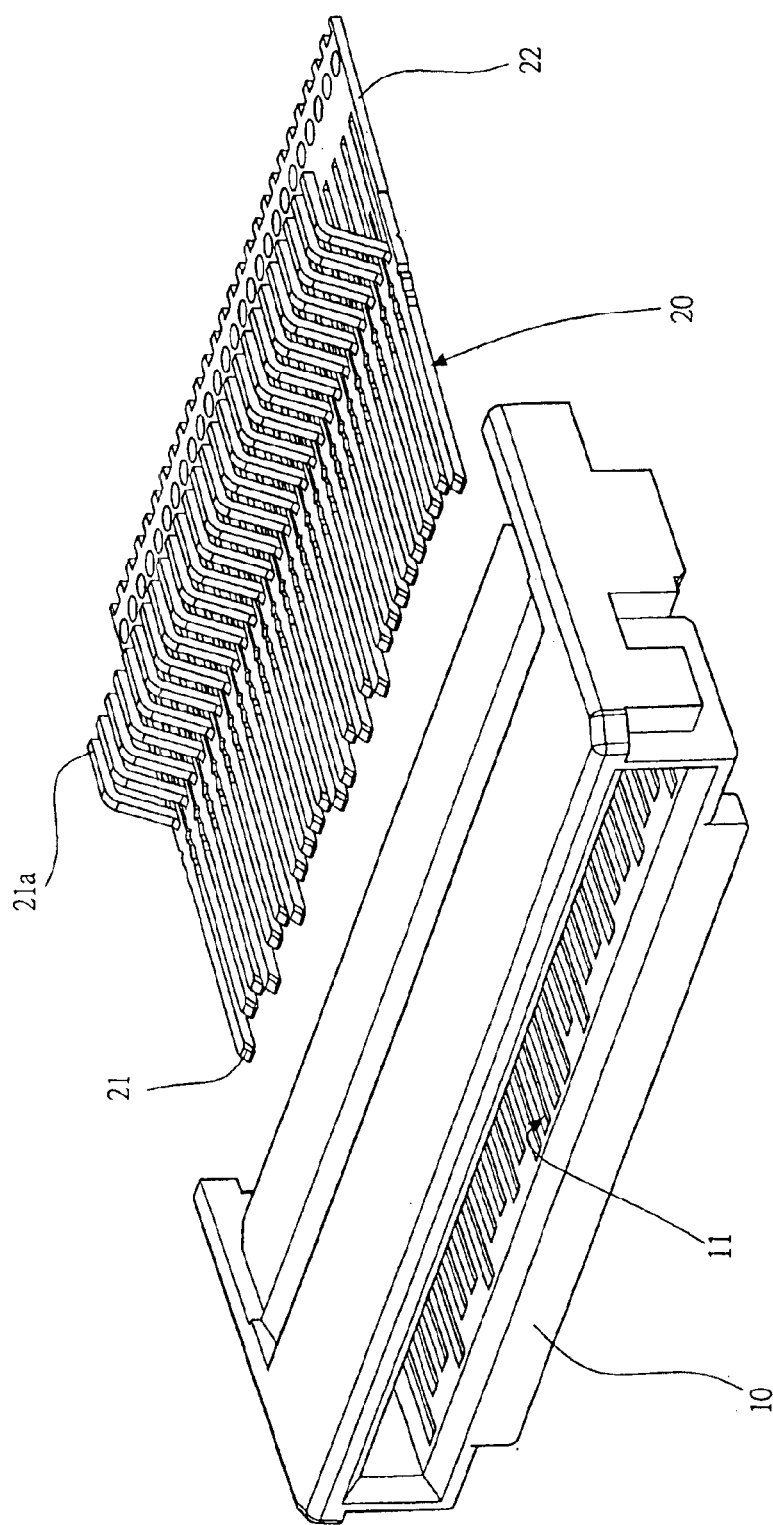
FIG. 4A shows a first schematic view illustrating the connector housing inserted by the terminals and joined with the PCB A according to the invention.
Figure 4B:
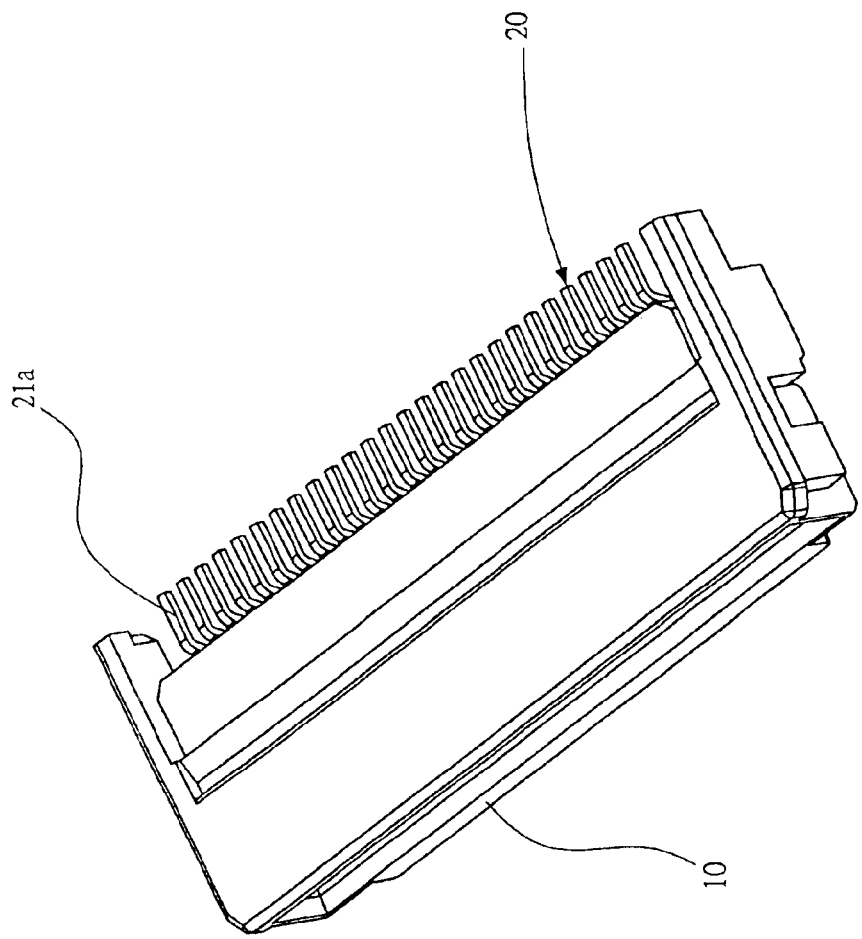
FIG. 4B shows a second schematic view illustrating the connector housing inserted by the terminals and joined with the PCB A according to the invention.

Referring to FIGS. 4A and 4B showing schematic views illustrating the connector housing 10 inserted with the terminals 20 and then joined with the PCB 2, the terminals 20 are inserted into the terminal groove 11 at the rear side of the connector housing 10. After snapping off the terminal bodies 21 at the front end of the terminals 20 from the connecting portion 22 at the rear end, the terminal pins 21a at the lower portion of the terminal bodies 21 are adhered to the PCB 2.

Figure 5:
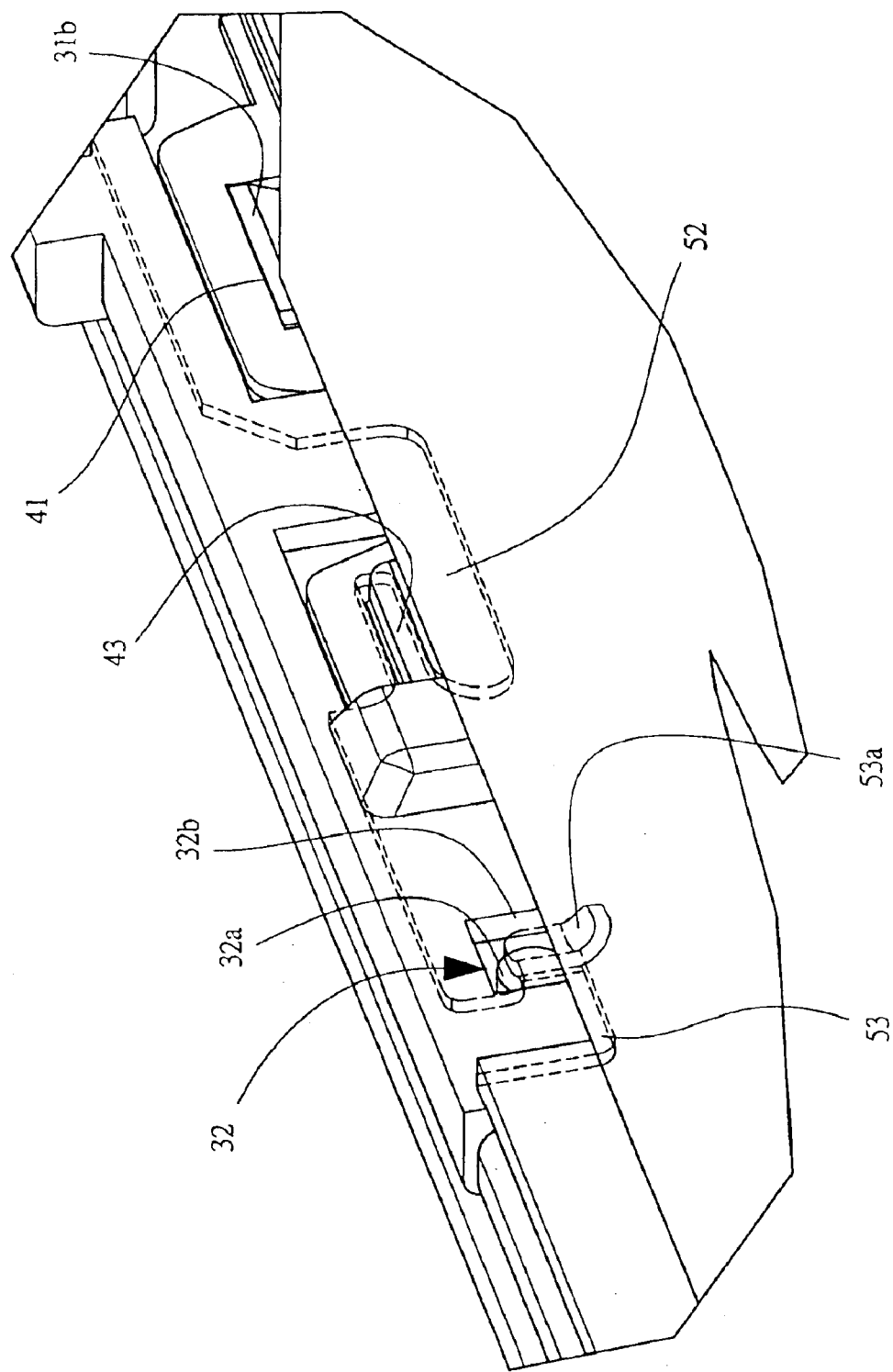
FIG. 5 shows an enlarged partial view illustrating an assembly of an upper housing, a main frame and a lower frame according to the invention.

Referring to FIG. 5 showing an enlarged partial view illustrating an assembly of the upper housing 50, the main frame 30 and the lower housing 40, the U-shaped clasp sections 52 at the two sides of the upper housing 50 are clasped with the corresponding inverted L-shaped sections 43 of the lower housing 40. When the upper housing 50 is fastened in a forward direction, the safety opening 32 at one side of the main frame 30 is corresponded with the safety fastening section 53 of the upper housing 50. FIGS. 6A and 6B show schematic views illustrating the safety fastening section 53 assembled with and released from the safety fastening opening 32 according to the invention, respectively. For that the safety fastening section 53 is an extruded square spring plate 53a, the square spring plate 53a is butted into the square recess 32b of the safety fastening opening 32 when fastened to form an assembly. To disassemble the structure, a long and thin round post 3 having a diameter smaller than that of the hole 32a of the safety fastening opening 32 is inserted into the hole 32a to push the square spring plate 53a inward, thereby accomplishing a release status by sliding the upper housing 50 in a backward direction.

Figure 7:
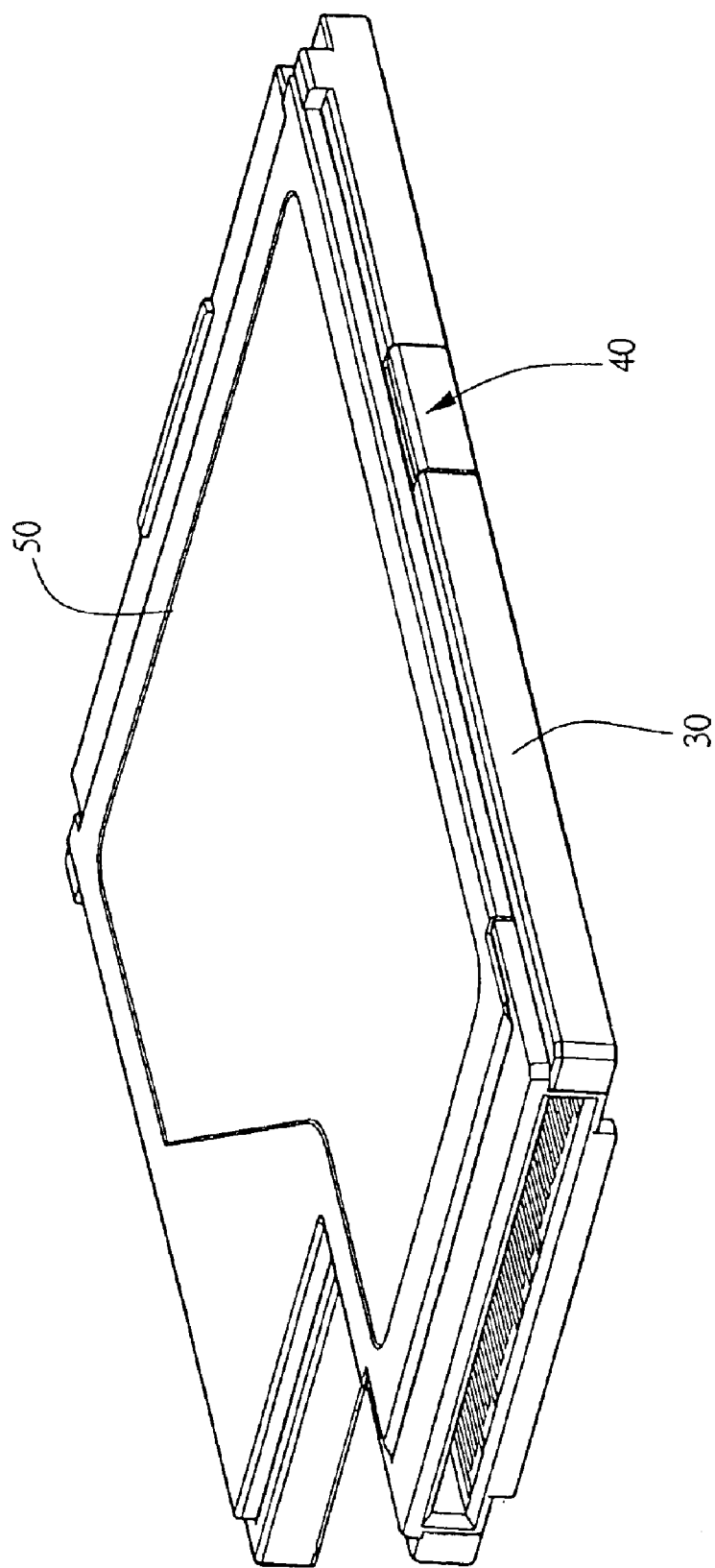
FIG. 7 shows an exploded elevational view illustrating another embodiment according to the invention.

Referring to FIG. 7 showing an exploded elevational view illustrating another embodiment according to the invention, the upper housing 50, the lower housing 40 and the main frame 30 are devised in other shapes for coordinating with new-type express card specifications.

According to the aforesaid assembled structure, the following effects are achieved:

1. Using the connect pin section between the terminal bodies and the connecting portion, the terminals are snapped off after being inserted into the terminal groove at the rear end of the connector housing, such that the terminal bodies are remained in the connector housing for speeding up time required for installation.
2. The locating sections at two outer left and right sides of the connector housing can be inserted into the locating notches of the main frame, thereby accurately installing the connector housing in the main frame.
3. By corresponding the fastening openings and inverted U-shaped clasp sections of the lower housing with the fastening sections and recesses of the main frame, the lower housing becomes firmed joined with the main frame.
4. By corresponding the U-shaped clasp sections of the upper housing with the inverted L-shaped clasp sections of the lower housing, the upper and lower housings are fastened with each other through sliding means.
5. When the upper housing is fastened in a forward direction, the safety fastening section of the upper housing is corresponded with and slid into the safety opening at one side of the main frame. Thus, it is unlikely that the fastened upper housing is slipped off and disengaged. In addition, the safety fastening section has an extruded square spring plate for facilitating dismantling thereof.

Conclusive from the above, the express card housing structure according to the invention accomplishes effects of simple installation and replacement procedures. It is of course to be understood that the embodiment described herein is merely illustrative of the principles of the invention and that a wide variety of modifications thereto may be effected by persons skilled in the art without departing from the spirit and scope of the invention as set forth in the following claims.

What is claimed is:

1. An express card housing structure comprising a connector housing, terminals, a main frame, a lower housing and an upper housing; and being characterized that:

the connector housing is an integral rectangular housing; and has a perforated terminal groove at a center section thereof, an opening at a front end thereof, locating sections at left and right sides thereof, and clasp channels at front and rear sides thereof;

each of the terminal is consisted of a terminal body at a front end thereof and a rear connecting portion at a rear end thereof, with a rear end of the terminal body downwardly bent to form a terminal pin; between the terminal body and the connecting portion is a connect pin section; and the terminal body at the front end is inserted into the terminal groove of the connector housing;

the main frame appears as a U-shape when viewed from above, and has a post at a front end of an opening thereof; each of left and right frames is disposed with a locating notch at a front end thereof, a plurality of fastening sections at an inner edge thereof, a recess at a center upper portion thereof; and the main frame is further disposed with a safety fastening opening at one side thereof;

the lower housing has a plurality of fastening openings at two lateral sides and a rear side thereof for corresponding with the fastening sections of the main frame, inverted U-shaped clasp sections extended outward and upward at center portions of two sides thereof for corresponding with recesses of the main frame, and a plurality of inverted L-shaped clasp sections at two lateral sides thereof, thereby arranging the lower housing below the main frame; the upper housing has clasp sections at a front end thereof for clasping with the clasp channels at two sides of the connector housing, a plurality of U-shaped clasp sections with openings facing a front side at two lateral sides thereof, a safety fastening section for corresponding with the fastening opening of the main frame and extruded with a square spring plate, and a downwardly bent baffle at a rear end thereof.

2. The express card housing structure in accordance with claim 1, wherein the main frame is formed by metal molding.

3. The express card housing structure in accordance with claim 1, wherein the safety fastening opening has a round hole at a center portion thereof, and a square recess is formed regarding a center of the aforesaid hole as a center at an inner side thereof and used for fastening with the safety fastening section.

4. The express card housing structure in accordance with claim 1, wherein the safety fastening section is downwardly extruded with a square spring plate at a side relative to the upper housing.

* * * * *